(12) United States Patent
Tomita et al.

(10) Patent No.: US 6,721,626 B2
(45) Date of Patent: Apr. 13, 2004

(54) WAFER TRANSFER SYSTEM, WAFER TRANSFER METHOD AND AUTOMATIC GUIDED VEHICLE SYSTEM

(75) Inventors: Masaru Tomita, Kyoto (JP); Shuji Akiyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/184,980

(22) Filed: Jul. 1, 2002

(65) Prior Publication Data
US 2003/0023343 A1 Jan. 30, 2003

(30) Foreign Application Priority Data
Jul. 24, 2001 (JP) ........................................ 2001-223059

(51) Int. Cl.⁷ .............................. G06F 7/00; B65G 49/07
(52) U.S. Cl. ........................ 700/218; 700/221; 414/937; 414/941
(58) Field of Search ................................. 700/215, 218, 700/221, 226; 414/222.02, 274, 937, 941; 901/46, 47

(56) References Cited

U.S. PATENT DOCUMENTS

| | | | | |
|---|---|---|---|---|
| 5,308,222 A | * | 5/1994 | Bacchi et al. | 414/936 |
| 5,387,067 A | * | 2/1995 | Grunes | 414/937 |
| 5,852,413 A | * | 12/1998 | Bacchi et al. | 341/13 |
| 5,928,389 A | * | 7/1999 | Jevtic | 29/25.01 |
| 5,944,476 A | * | 8/1999 | Bacchi et al. | 901/48 |
| 6,146,077 A | * | 11/2000 | Shin et al. | 414/937 |
| 6,236,903 B1 | * | 5/2001 | Kim et al. | 700/221 |
| 6,366,830 B2 | * | 4/2002 | Bacchi et al. | 700/250 |

FOREIGN PATENT DOCUMENTS

JP 7-117847 5/1995

* cited by examiner

Primary Examiner—Gene O. Crawford
(74) Attorney, Agent, or Firm—Westerman, Hattori, Daniels & Adrian, LLP (57) ABSTRACT

A central position of a wafer 10 set on a place table 41 is calculated, a turn angle of the place table 41 when the wafer 10 is in the predetermined orientation is calculated based on the calculation result of the central position and positional information of an ID mark 11 received in advance and the quantity of expanding and contracting a transfer arm 30 and the turn angle of a turntable 39 are calculated for setting the wafer 10 such that the ID mark 11 is in the predetermined position and orientation to an OCR 43, and the turn angle of the place table 41 calculated based on the turn angle of the turntable 39 is corrected, the place table 41 is turned only by the corrected turn angle and the wafer 10 is turned and transferred to the OCR 43 by the transfer unit 3.

3 Claims, 11 Drawing Sheets

FIG. 11

WAFER TRANSFER SYSTEM, WAFER TRANSFER METHOD AND AUTOMATIC GUIDED VEHICLE SYSTEM

FIELD OF THE INVENTION

The present invention relates to a wafer transfer system and method, and an automatic guided vehicle system having a transfer unit wherein arms for transferring the wafers are provided on a turntable, an orientation unit which adjusts the orientation and direction of the wafers set on a place table and a reading unit which reads an ID put in the wafer side by side. For example, the wafer transfer system is loaded in an automatic guided vehicle which carries and transfers the wafers automatically between stations in a semiconductor manufacturing plant.

BACKGROUND OF THE INVENTION

So far, the orientation unit is operated for putting the wafer in the predetermined position and orientation to the transfer unit for reading the ID information put in the wafer by an OCR and the transfer unit sets the wafer to the OCR.

More specifically, the positioning unit comprises a move table which can move to two axel which cross on a horizontal plane and a turnable place table disposed on it, and this orientation unit turns the place table with placing the wafer on it, an orientation flat position (or a notch position) of the wafer is detected by a sensor and a peripheral turn track of the measured wafer is compared with a basic turn track memorized in advance, so that the difference between the central position in the wafer and the basic position is calculated, and the place table is turned for putting the wafer in the predetermined orientation and the move table is moved such that the center of the wafer is placed on the predetermined position based on this calculation result. Thus, as the wafer can be moved to an area where the OCR can read the ID mark in the correct and proper orientation when the position and orientation of the wafer are adjusted in advance, the OCR can read the ID mark without failing.

The above transfer unit needs a move table which can move the wafers horizontally with high accuracy and it also takes time to move the wafer. Consequently, it is an object of the present invention to eliminate this move table, to reduce time for orienting the wafer and to improve transfer efficiency of the wafer.

SUMMARY OF THE INVENTION

The problem to be solved by the present invention is described above, and a means for solving the problem will be described next.

First, a wafer transfer system having a transfer unit wherein arms for transferring wafers are provided on a turntable, an orientation unit which adjusts the orientation and direction of the wafer set on a place table and a reading unit which reads an ID mark put in a wafer, is provided with a calculation means which calculates a central position of the wafer set on the place table, a turn angle calculation means for calculating a turn angle for the wafer to be in a predetermined orientation based on a calculation result of the calculation means and positional information of the ID mark received in advance, a transfer quantity calculation means which calculates a quantity of expanding and contracting the arm in the transfer unit and a turn angle of the turntable necessary for setting the wafer in the predetermined orientation such that the ID mark comes to a predetermined position and orientation to the reading unit and a correction means which corrects the turn angle of the place table calculated by the turn angle calculation means based on the turn angle of the turntable calculated by the transfer quantity calculation means.

Additionally, regarding a wafer transfer method having a transfer unit wherein arms for transferring wafers are provided on a turntable, an orientation unit which adjusts the orientation and direction of the wafer set on a place table and the reading unit which reads the ID mark put in the wafer, a central position of the wafer set on the place table is calculated, a turn angle of the place table that the wafer comes to a predetermined orientation is calculated based on the calculated central position of the wafer and positional information of the ID mark received in advance, a quantity of expanding and contracting the arm and a turn angle of the turntable in the transfer unit necessary for setting the wafer in a predetermined orientation such that the ID mark comes to a predetermined position and orientation to the reading unit are calculated, the calculated turn angle of the place table is corrected based on the calculated turn angle of the turntable, the place table is turned only by the turn angle after correcting and the wafer is turned, the turned wafer is moved to the reading unit side by the transfer unit and the wafer is set such that the ID mark is in the predetermined position and orientation to the reading unit.

Furthermore, the wafer transfer system as described in claim 1 is provided with the automatic guided vehicle in the automatic guided vehicle system comprising an automatic guided vehicle having a transfer unit wherein arms for transferring the wafers are provided on a turntable, an orientation unit which adjusts the orientation and direction of the wafer set on the place table and a reading unit which reads the ID mark put in the wafer.

DETAILED DESCRIPTION OF THE PREFERRED EMBODIMENT

Next, a preferred embodiment of the present invention will be described with reference to the drawings.

First, the total configuration of an automatic guided vehicle 1 will be described.

Figure 1:
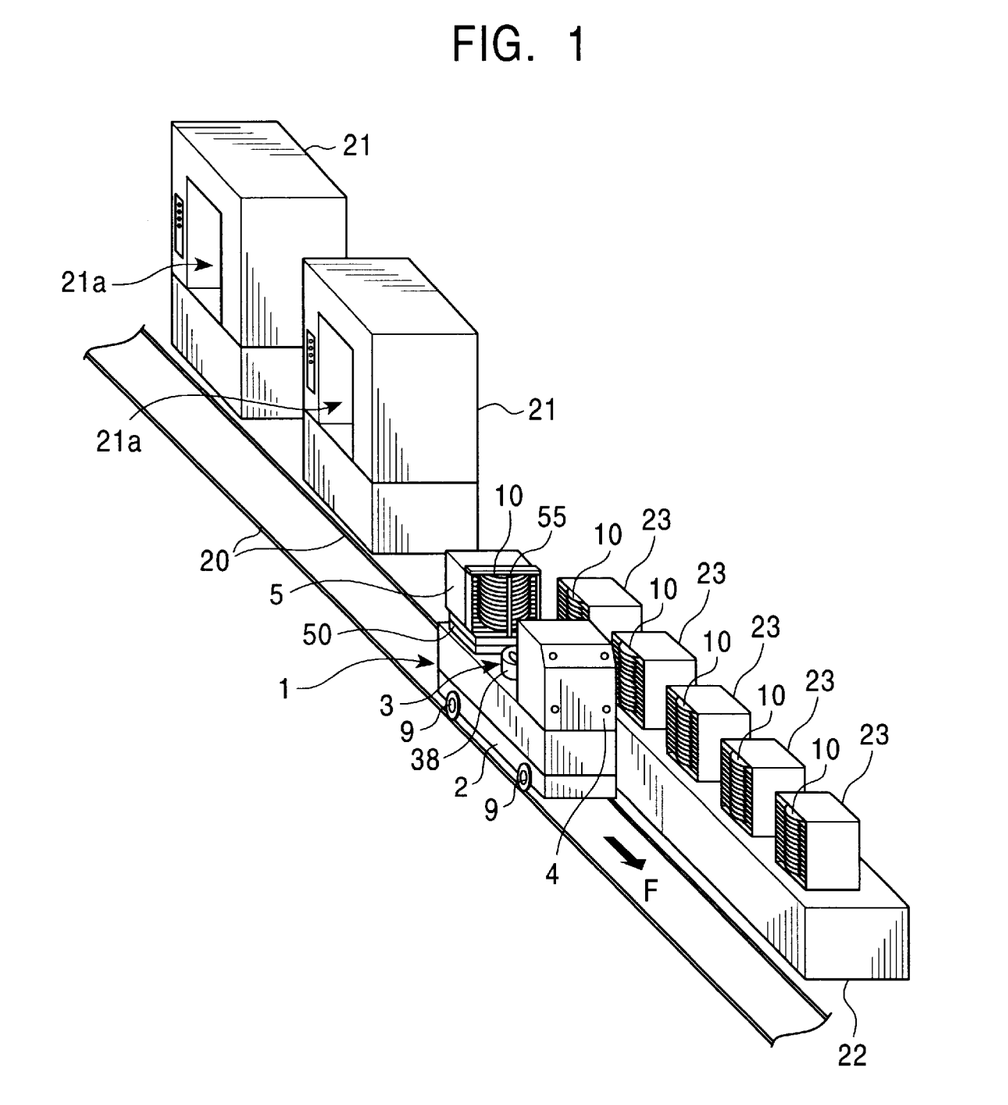
FIG. 1 is a perspective view illustrating an appearance of an automatic guided vehicle in a clean room.

In the following description, an arrow F direction in FIG. 1 shows the front and the physical relationship of each component will be described. Moreover, the positional relationship of each component in the other drawings also conforms to the one in FIG. 1.

As described in FIG. 1, the automatic guided vehicle 1 is a track guided vehicle which travels on traveling rails 20 automatically and a vehicle body 2 is supported by four traveling wheels 9 which are driven by respective drive motors 8 (FIG. 2) and the automatic guided vehicle 1 is traveled on the traveling rails 20 by the four wheel drive.

Additionally, it is enough to transmit drive to the whole traveling wheels 9 in order to minimize the slip between the traveling rails 20 and the traveling wheels 9 and the transmission mechanism is optional.

Processing equipments 21, a stocker 22 are disposed along the traveling rails 20 and a plurality of cassettes 23 is provided on the stocker 22 at predetermined spaces. The respective cassettes 23 are disposed with an opening toward the traveling rails 20 sides and multiple shelves for retaining side ends of a wafer 10 are provided vertically in an inner face of the front and rear of the cassette 23 and multiple wafers 10 are stored horizontally in the cassette 23.

Figure 2:
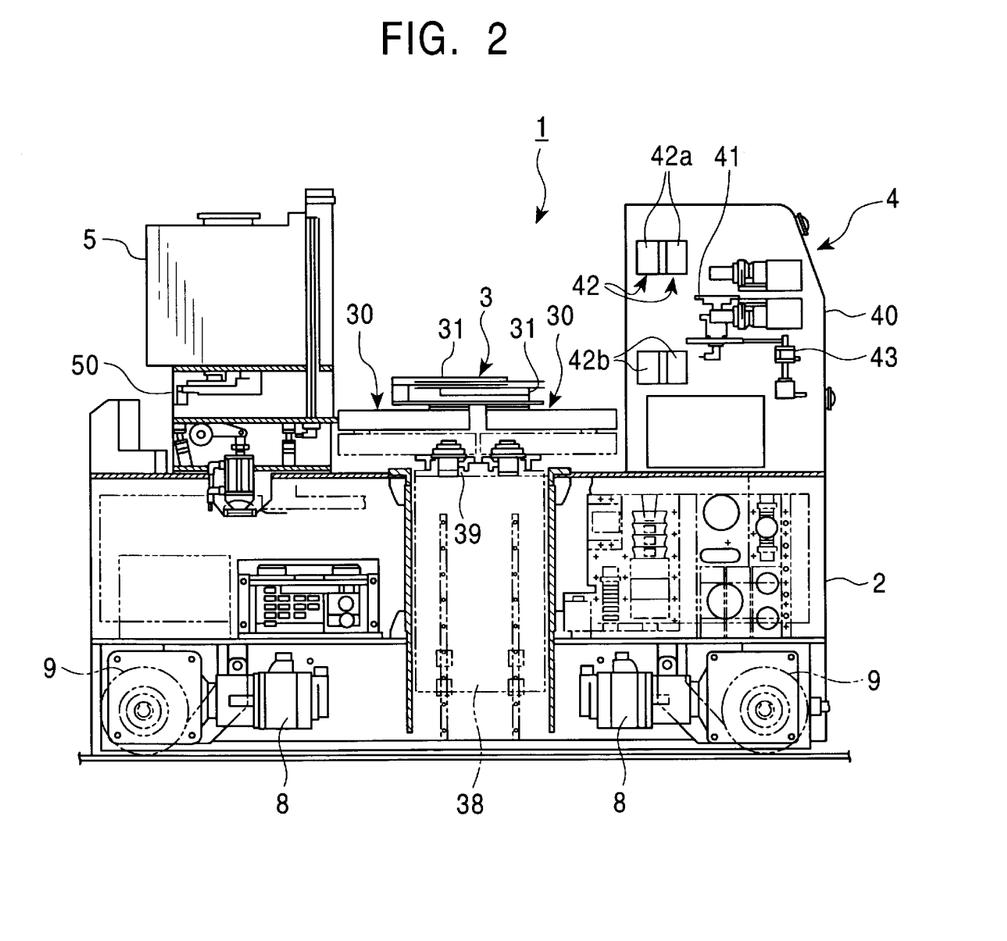
FIG. 2 is a side sectional view of the automatic guided vehicle.
Figure 3A:
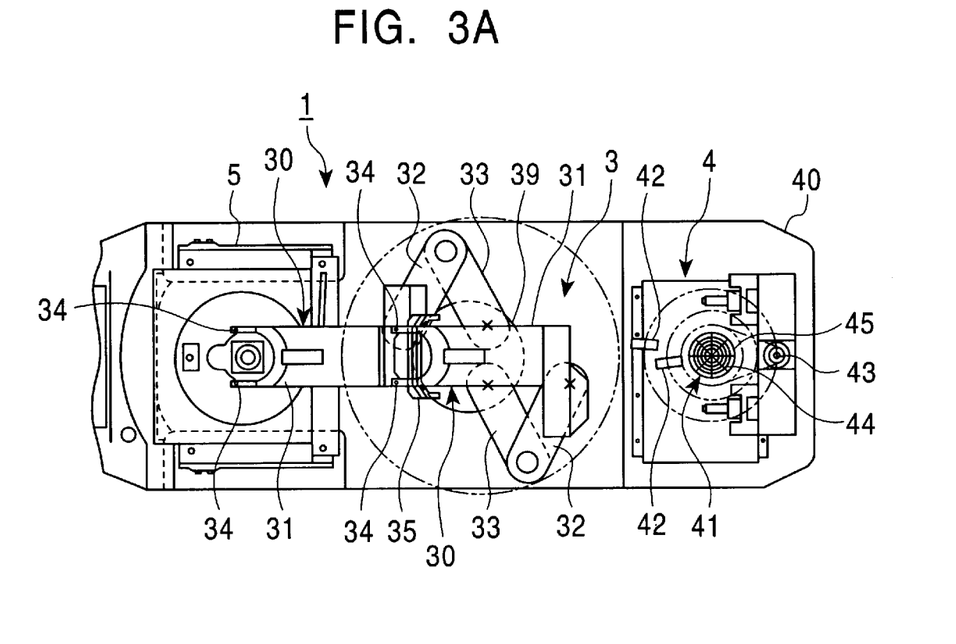
FIG. 3A is a plan view of the automatic guided vehicle when a wafer is picked up from a buffer cassette and FIG. 3B is a plan view of the automatic guided vehicle when the wafer is transferred to an orientation unit.
Figure 3B:
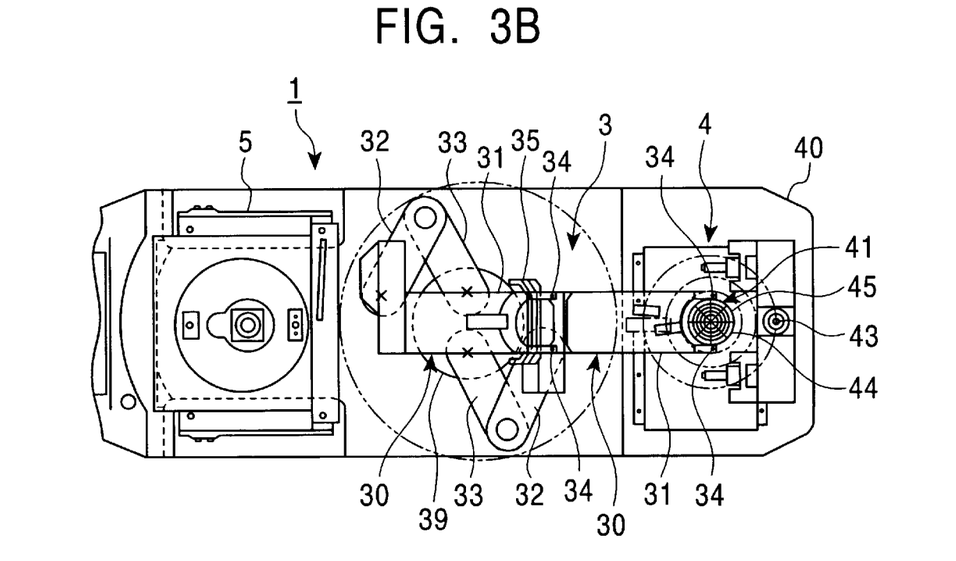

As illustrated in FIG. 2, FIG. 3A and FIG. 3B, a transfer unit 3 which transfers the wafers 10 are disposed in the center of the vehicle body 2 in the automatic guided vehicle 1 and an orientation unit 4 which adjusts the direction and center of the wafers 10 and a buffer cassette 5 which stores the wafers 10 are disposed in the front and rear of the transfer unit 3.

The buffer cassette 5 is disposed on a buffer table 50 with the opening toward the front (the transfer unit 3 side). Multiple shelves which retains side ends of the wafer 10 are respectively provided vertically in the inner side face or the right and left in the buffer cassette 5 and the wafers 10 are stored in the buffer cassette 5 horizontally.

Figure 4A:
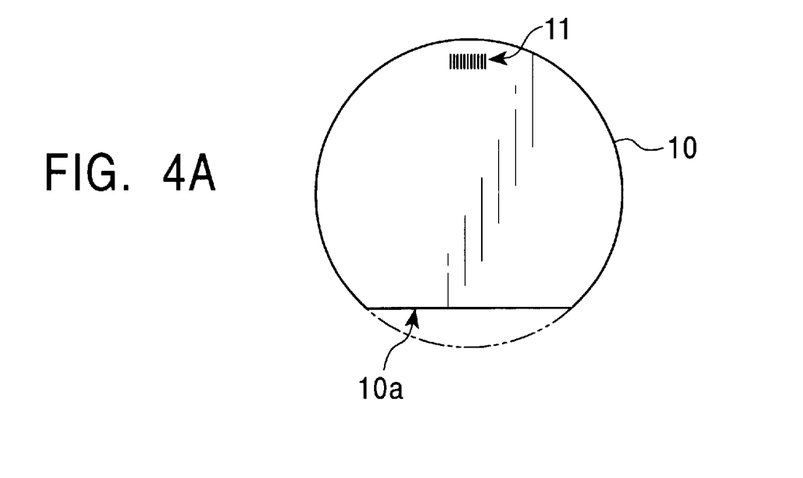
FIG. 4A is a plan view of the wafer having an orientation flat wherein an ID mark is put in the normal position.
Figure 4B:
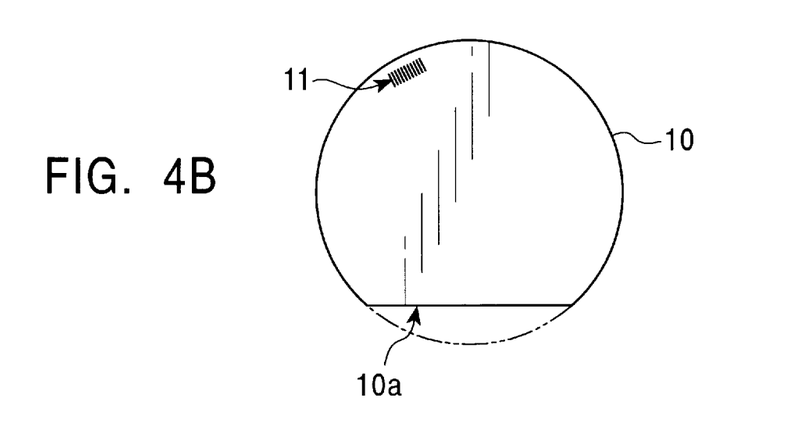
FIG. 4B is a plan view of the wafer having the orientation flat wherein the ID mark is put by displacing from the normal position to the circumferential direction and FIG. 4C is a plan view of the wafer having the orientation flat wherein the ID mark is put by moving from the normal position in parallel.
Figure 4C:
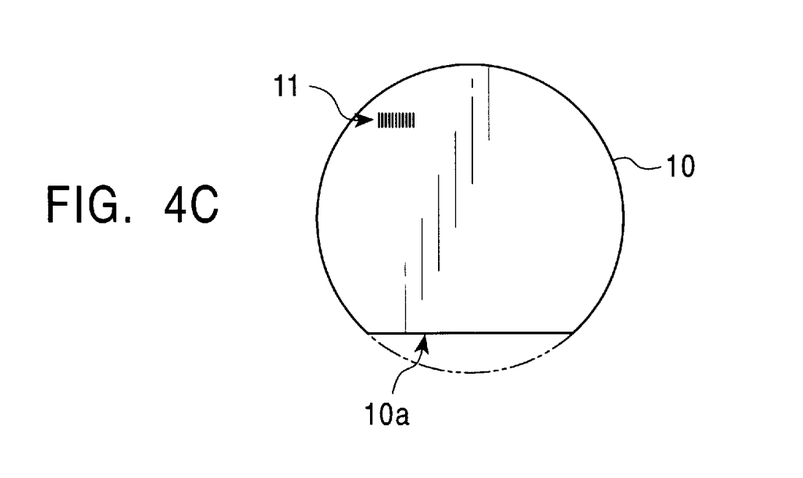
Figure 5A:
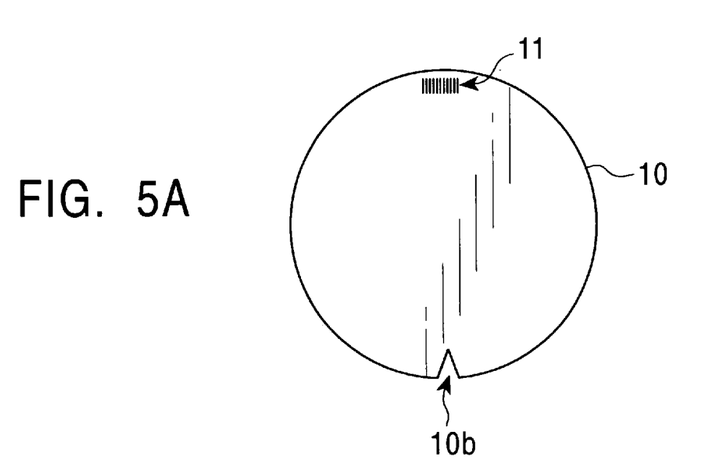
FIG. 5A is a plan view of the wafer having a notch wherein the ID mark is put in the normal position.
Figure 5B:
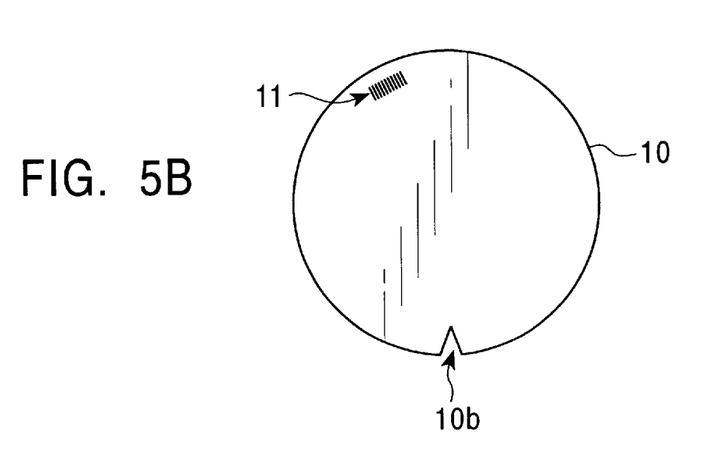
FIG. 5B is a plan view of the wafer having the notch wherein the ID mark is put by displacing from the normal position to the circumferential direction and FIG. 5C is a plan view of the wafer having the notch wherein the ID mark is put by moving in parallel from the normal position.
Figure 5C:
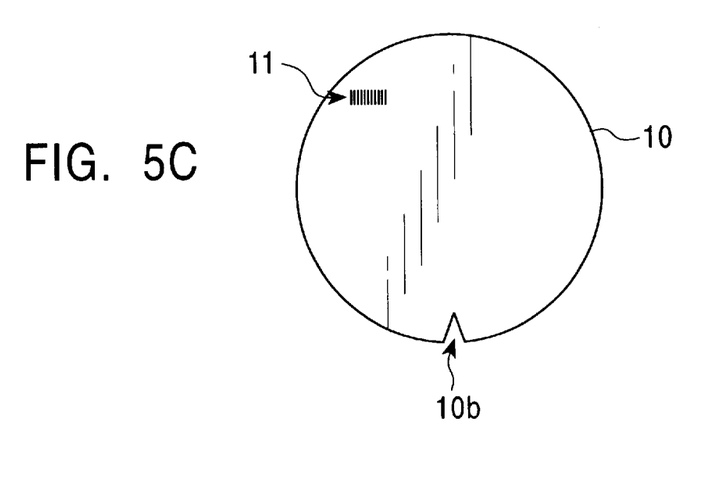

As the wafer 10 comprises a silicon single crystal and is almost disciform and the silicon crystal has a sense of direction, some wafers 10 have a line part which indicates the direction that is an orientation flat 10a formed in a part of the periphery of the wafer 10 as illustrated in FIGS. 4A–4C and other wafers 10 have a notch 10b that a part of the periphery of the wafer 10 is cut as illustrated in FIGS. 5A–5C, and an ID mark 11 encoding the wafer information such as the wafer manufacturing record is put in the surface or back side of the peripheral part in each wafer.

This ID mark 11 is disposed in the peripheral part on the opposite side of the orientation flat 10a (or notch 10b) in the face of the wafer 10 as illustrated in FIG. 4A (or FIG. 5A), is disposed by displacing from the normal position illustrated in FIG. 4A (or FIG. 5A) to the circumferential direction as illustrated in FIG. 4B (or FIG. 5B) or is disposed in the peripheral part of the wafer 10 by moving it from the normal position in parallel as illustrated in FIG. 4C (or FIG. 5C), and the positional relation between the ID mark 11 and the orientation flat 10a (or the notch 10b) is set in advance in any cases. Consequently, when the position of the orientation flat 10a (or the notch 10b) in the wafer 10 is detected, the position of the ID mark 11 can be calculated indirectly based on the positional relation.

Next, the transfer unit 3 will be described.

As illustrated in FIG. 2, FIG. 3A and FIG. 3B, the transfer unit 3 comprises transfer arms 30, a base 38, turntables 39 etc., the base 38 being buried in the center of the vehicle body 2, the turntable 39 being provided rotatably on the base 38 and a pair of the transfer arms 30 being installed on the turntable 39.

An elevating mechanism 61 (block diagram in FIG. 6) is provided, wherein the base 38 can move up and down, a rod making a thread is arranged vertically on the side of the base 38 and supported rotatably, a nut runner installed in the lower part of the base 38 fixedly is embedded in the rod, the nut runner goes up and down by rotating the rod with the electric motor and the base 38 goes up and down.

Moreover, the turntable 39 can turn to the base 38 and the turntable 39 can be driven to turn by the electric motor (block diagram in FIG. 6) buried in the base 38.

The transfer arm 30 is a scholar arm type robot hand which forms a link mechanism by a transfer hand 31, a first arm 32 and a second arm 33, and the transfer arm 30 can bend and stretch with an actuator 63 (FIG. 6) comprising the servo motor etc.

Figure 6:
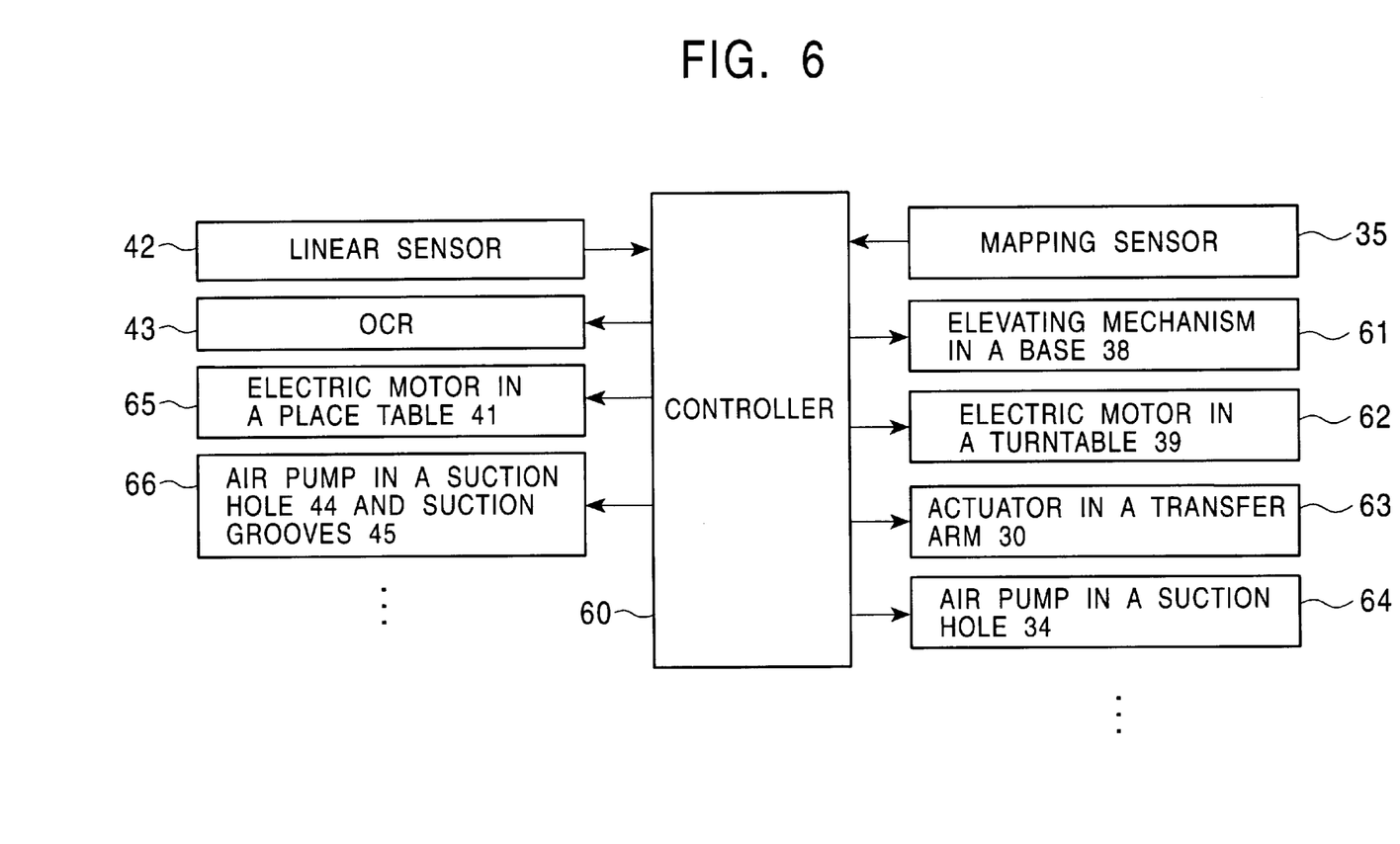
FIG. 6 is a block diagram illustrating a control configuration of the automatic guided vehicle.

The transfer hand 31 is formed almost concave seen from the top and suction holes 34 are provided in the bifurcate tip part and it is composed such that the wafer 10 is sucked and retained by the transfer hand 31 by sucking with an air pump 64 in the block diagram of FIG. 6.

Thus, a mapping sensor 35 is installed in the end part of one transfer arm 30 on the opposite side of the suction holes 34 of the transfer hand 31.

The tip of the mapping sensor 35 is bifurcated and is "V" shape seen from the top and the photoelectric sensors are installed in the both tip ends. In this configuration, the base 38 is lifted, the transfer arm 30 is bended and stretched and the mapping sensor 35 gets close to the buffer cassette 5, and the base 38 goes downward and the mapping sensor 35 searches each shelf in the buffer cassette 5 for detecting the presence of the wafers 10.

FIG. 6 is a block diagram illustrating the control configuration, and the elevating mechanism 61 which moves the base 38 up and down, an electric motor 62 which turns the turntable 39, the actuators 63 which bend the transfer arms 30, the air pump 64 which sucks the wafer 10 with the suction holes 34 and the mapping sensor 35 are connected to a controller 60 built in the vehicle body 2 and it is operated in the predetermined procedure.

Next, the orientation unit 4 will be described.

As illustrated in FIG. 2, FIG. 3A and FIG. 3B, the orientation unit 4 comprises a casing 40, a place table 41, linear sensors 42 and an optical character reader (hereinafter called OCR) 43 etc., and the transfer unit 3 side in the casing 40 opens and two pairs of the linear sensors 42 are disposed in the vicinity of the entrance and a projector 42a is buried on the ceiling and a light sensor 42b is buried on the floor respectively. Regarding two pairs of the linear sensors 42, the outer linear sensor 42 (the entrance side of the opening of the casing 40) detects the orientation flat 10a position (or the notch 10b position) of the 12-inch wafer 10 and the inner linear sensor 42 (the back side of the opening of the casing 40) detects the orientation flat 10a position (or the notch 10b position) of the 8-inch wafer 10.

Moreover, the OCR 43 is buried in the back side on the floor face of the opening of the casing 40 and the wafer 10 is set by making the face with the ID mark 11 down in the casing 40 and the ID mark 11 is read by the OCR 43. Additionally, the wafer 10 can be set by making the face of the ID mark 11 upward, and in this case, the OCR 43 can be disposed in the back side on the ceiling face of the opening in the casing 40, or a pair of the upper and lower OCRs 43 can be disposed on the ceiling face of the opening in the casing 40 and on the back side of the floor face on ground that the upper and lower faces of the wafer 10 are exchanged in the working process.

Moreover, the place table 41 wherein the wafer 10 is placed is provided on the floor face in the opening of the casing 40. The place table 41 is disciform and a plurality of suction grooves 45 is disposed concentrically and radially from the center of rotation on the place face and a suction hole 44 is provided in the center (the rotation center). An air pump 66 (FIG. 6) is connected to these suction holes 44 and suction grooves 45, and the wafer 10 placed on the place table 41 is sucked and retained by operating the air pump 66. Thus, the wafer 10 is prevented from spinning off from the place table 41 by centrifugal force when the place table 41 is turned by an electric motor 65 (FIG. 6).

The electric motor 65 which turns this place table 41, the air pump 66 which sucks the wafer 10 in the suction hole 44, the linear sensors 42 and the OCR 43 are connected to the controller 60 as illustrated in FIG. 6 and they are operated by the control signal from the controller 60.

The configuration summary of the automatic guided vehicle 1 is described above, and the automatic guided vehicle 1 is operated as follows:

First, the automatic guided vehicle 1 is moved to the predetermined cassette 23 position on the stocker 22. The transfer hand 31 is let down here and each shelf in the buffer cassette 5 is searched by the mapping sensor 35 in the tip for detecting the presence of the wafers 10, and the wafers 10 in the cassette 23 are picked up one by one by the transfer unit 3 and are transferred to the shelf with no wafer in the buffer cassette 5.

Then, the wafers 10 are transferred to the buffer cassette 5 by making the face with the ID mark 11 down.

Next, the automatic guided vehicle 1 is moved to the processing equipment 21 position, the wafers 10 in the buffer cassette 5 are picked up one by one by the transfer unit 3 and set in the orientation unit 4, the ID mark 11 on the undersurface side of the wafer 10 is read by the OCR 43, the direction and central position of the wafer 10 is adjusted and the wafer is transferred to the processing equipment 21. The processing equipment 21 inspects the wafer based on the ID information put in this ID mark 11. Thus, the inspected wafer 10 is picked up by the transfer unit 3 and stored in the buffer cassette 5 again. Consequently, the wafers 10 in the buffer cassette 5 are inspected continuously.

The orientation of the wafer 10 is focused especially in the present invention aid the time necessary for this orientation is reduced by annexing the control means as described later and the transfer efficiency of the wafer 10 is improved. More precisely, a calculation function of calculating the central position of the wafer 10 set on the place table 41, a turn angle calculation function of calculating the turn angle of the place table 41 when the wafer 10 is placed in the predetermined orientation based on the calculation result by the calculation function and positional information of the ID mark 11 received in advance, a transfer quantity calculation function of calculating the expanding and contracting quantity of the transfer arm 30 and the turn angle of the turntable 39 when the wafer 10 is set such that the ID mark 11 is in the predetermined position and orientation to the OCR 43 and a correction function of correcting the turn angle of the turntable 41 which is calculated once by the turn angle calculation function based on the turn angle of the turntable 39 calculated by the transfer quantity calculation function are annexed to the controller 60.

Figure 7:
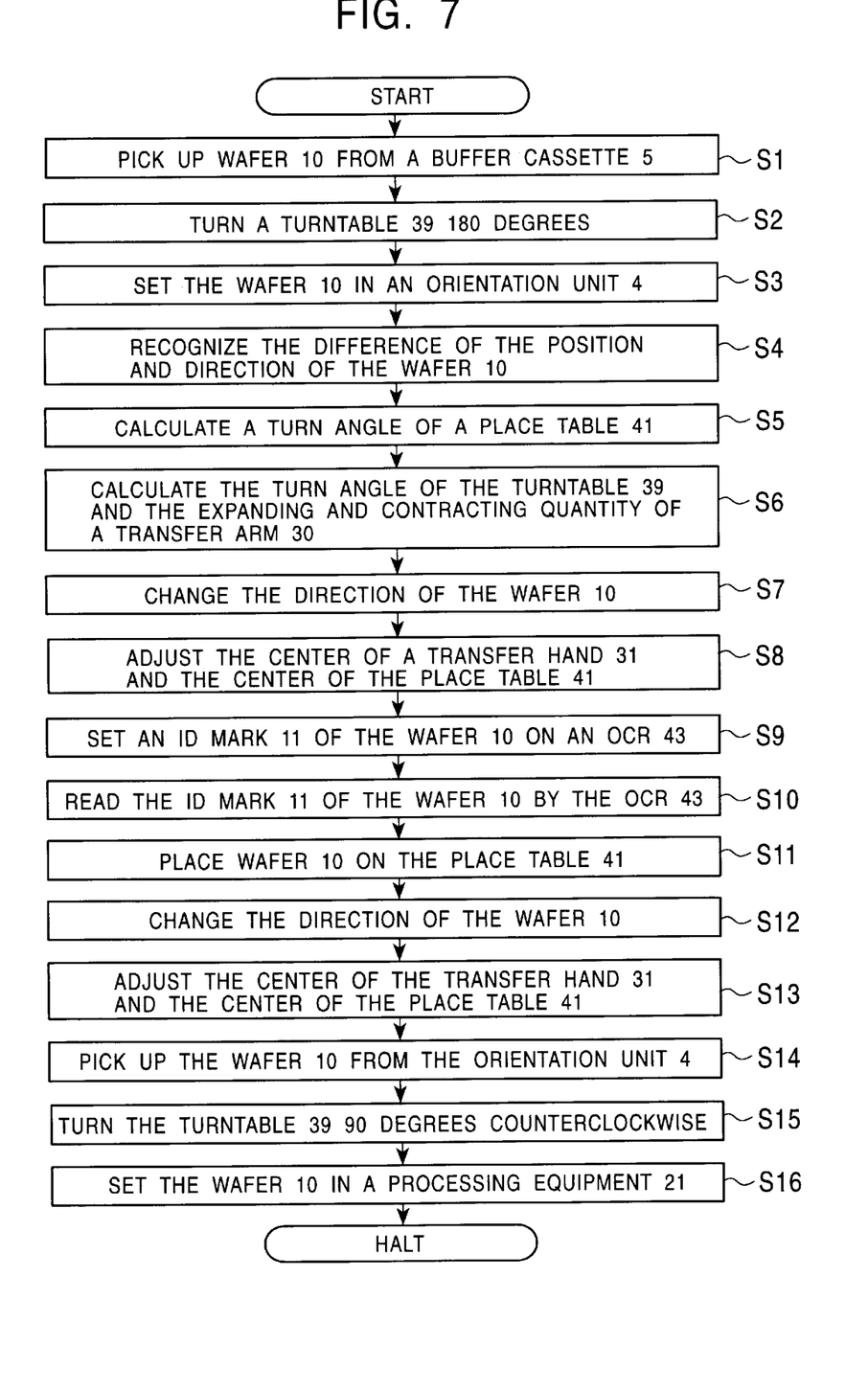
FIG. 7 is a flow chart illustrating a transfer process of the wafer by the automatic guided vehicle 1.

According to the above configuration, the wafer 10 is oriented as follows:

FIG. 7 is a flow chart which illustrates the flow, and first, the automatic guided vehicle 1 is moved to the processing equipment 21 position as described above and the transfer unit 3 in the automatic guided vehicle 1 is arranged to face to an entrance 21a in the processing equipment 21. Next, the base 38 is elevated, one transfer arm 30 is extended, the wafer 10 in the buffer cassette 5 is scooped by the transfer hand 31 and sucked and retained with the suction holes 34, 34 as illustrated in FIG. 3A, the transfer hand 31 is pulled out by bending the transfer arm 30 and the wafer 10 is picked up one by one from the buffer cassette 5 (step S1).

Next, the base 38 is let down to the predetermined height, the turntable 39 is turned 180 degrees, the direction of the transfer arms 30 is reversed and the transfer hand 31 which retains the wafer 10 is turned to the orientation unit 4 side (step S2).

Figure 8A:
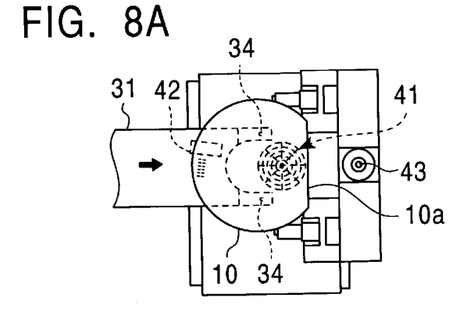
FIG. 8A is a plan view of the orientation unit illustrating an appearance in orienting the wafer that the ID mark is put in the normal position when the wafer is set in the orientation unit.

As illustrated in FIG. 3B and FIG. 8A, after the wafer 10 is set in the place table 41 in the state that the transfer arm 30 is bended and stretched and the transfer hand 31 is inserted into the orientation unit 4 and the center of the transfer hand 31 (the midpoint of the suction holes 34) is adjusted to the rotation center of the place table 41, the suction in the suction holes 34 is stopped, the transfer arm 30 is let down, the transfer hand 31 is taken off from the wafer 10 and the transfer hand 31 is prevented from disturbing the turning of the place table 41 (step S3). Additionally, the transfer arm 30 is bended without letting down and the transfer hand 31 can be pulled out from the power part of the wafer 10.

Figure 8B:
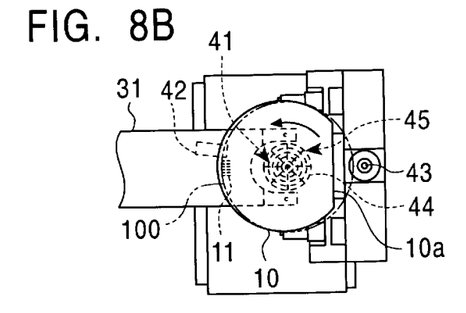
FIG. 8B is a plan view of the orientation unit when a linear sensor recognizes a turn track of the wafer.

Thus, the wafer 10 is placed on the place table 41 temporarily first and the place table 41 is turned 360 degrees as illustrated in FIG. 8B in the state of sucking and retaining with the suction hole 44 and the suction grooves 45 on the place table side. Therefore, the linear sensor 42 recognizes the orientation flat 10a position (or the notch 10b position) of the wafer 10 and the turn track made by the wafer 10 and the recognition result is output to the controller 60 (step S4).

A turn track 100 when the wafer 10 is set in the normal position of the place table 41 (the position that the center is adjusted to the rotation center of the place table 41) is memorized in the controller 60 in advance. The wafer 10 placed on the place table 41 temporarily is turned eccentrically by the rotation of the place table 41 because of the displacement of the place position, however the eccentric rotation track and the normal rotation track 100 are compared by the calculation function of the controller 60 and the difference between the rotation centers of the place table 41 and the wafer 10 is calculated.

Moreover, as the recognized orientation flat 10a (or the notch 10b) position in the wafer 10 is referred to by positional information of the ID mark 11 and the orientation flat 10a (or the notch 10b) in the wafer 10, the place and position of the ID mark 11 put in the wafer 10 face is calculated.

The turn angle of the place table 41 necessary for placing this calculated ID mark 11 in the predetermined orientation is calculated by the turn angle calculation function of the controller 60 (step S5). Additionally, this stage only includes calculating the necessary turn angle of the place table 41 and the place table 41 is not actually turned. The predetermined orientation of this wafer 10 means the orientation that the OCR 43 can read the ID mark 11 if the wafer 10 on the place table 41 can be moved in parallel such that the ID mark 11 is placed right above the OCR 43. More precisely, the position of the ID mark 11 (the direction of the ID mark 11) to the OCR 43 is set in advance for reading the ID mark 11 normally by the OCR 43 and the ID mark 11 must be turned to the OCR 43 so as to be the position. In the preferred embodiment of the present invention, the angle that the place table 41 must be turned for presenting the same direction on the place table 41 is calculated by the turn angle calculation function.

Figure 11:
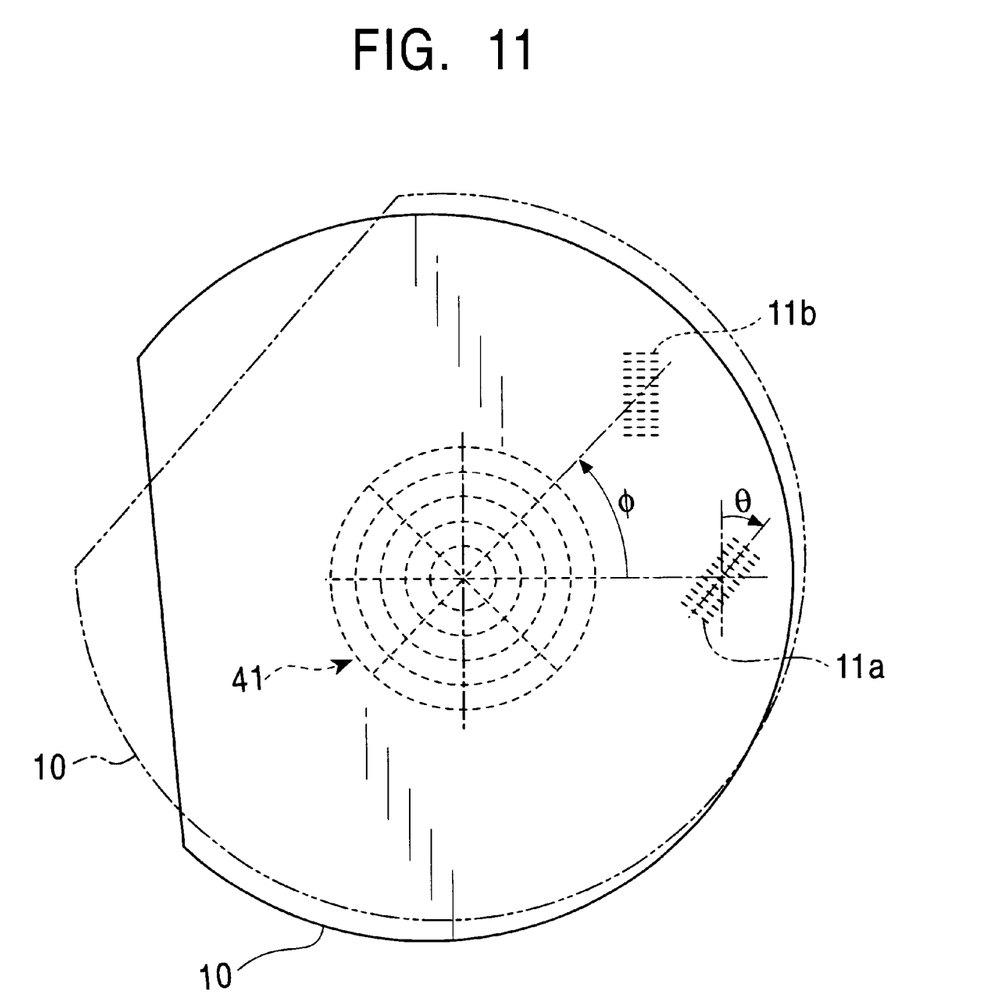
FIG. 11 is a plan view of the wafer which describes the turn angle in orienting the wafer wherein the ID mark is put by moving it from the normal position in parallel.

More specifically, the place table 41 must be turned for correcting the tilt θ of this ID mark 11a if the wafer 10 is placed on the place table 41 and the ID mark 11 is in the orientation of a code 11a as illustrated in FIG. 11, however the required turn angle is calculated by the turn angle calculation function. Additionally, as the center of the wafer is displaced from the rotation center of the place table 41, the necessary turn angle is not exactly adjusted to the angle θ of tilting the ID marn 11a. Actually, the difference between the center of the wafer and the rotation center of the place table 41 is considered and the turn angle is calculated.

Next, the expanding and contracting quantity of the transfer arm 30 and the turn angle of the turntable 39, necessary for moving the wafer 10 on the place table 41 by the transfer unit 3 such that the ID mark 11 is placed right above the OCR 43, is calculated by the transfer quantity calculation function of the controller 60 (step S6).

The turn angle of the place table 41 which is once calculated by the turn angle calculation function is corrected by the correction function of the controller 60 based on the turn angle of the turntable 39 calculated by the transfer quantity calculation function (step S7). Actually, the place table 41 is turned only by this corrected turn angle (step S8).

Figure 8C:
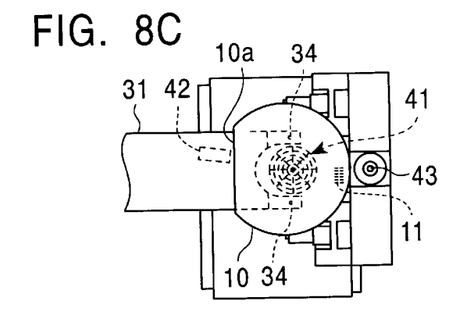
FIG. 8C is a plan view of the orientation unit when a place table is turned to the corrected turn angle.
Figure 9A:
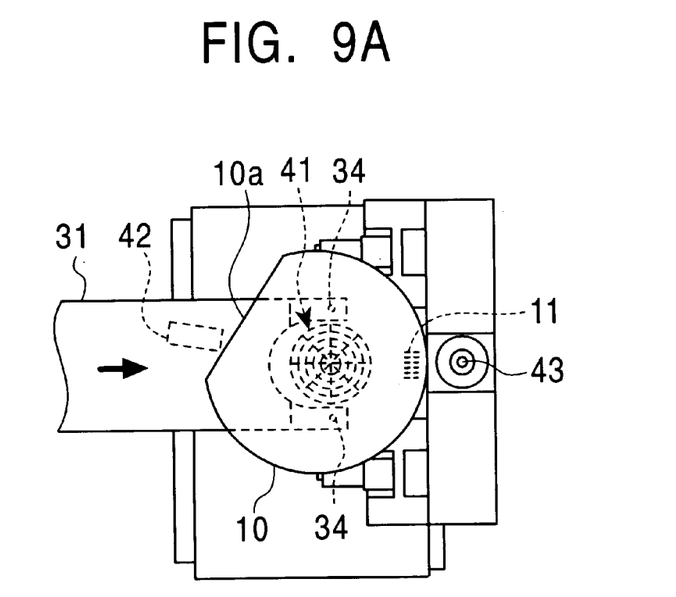
FIG. 9A is a plan view of the orientation unit illustrating an appearance of the orientation that the ID mark is put by displacing from the normal position to the circumferential direction when the place table is turned to the corrected turn angle and FIG. 9B is a plan view of the orientation unit when the ID mark of the wafer is set in the OCR.

More precisely, if the ID mark 11 put in the peripheral part of the wafer 10 is put along the circumferential direction (tangent direction) as illustrated in FIGS. 4A, 4B or FIGS. 5A, 5B, the place table 41 is turned such that the ID mark 11 comes to the almost front position on the wafer 10 face as illustrated in FIG. 8C or FIG. 9A.

Figure 10A:
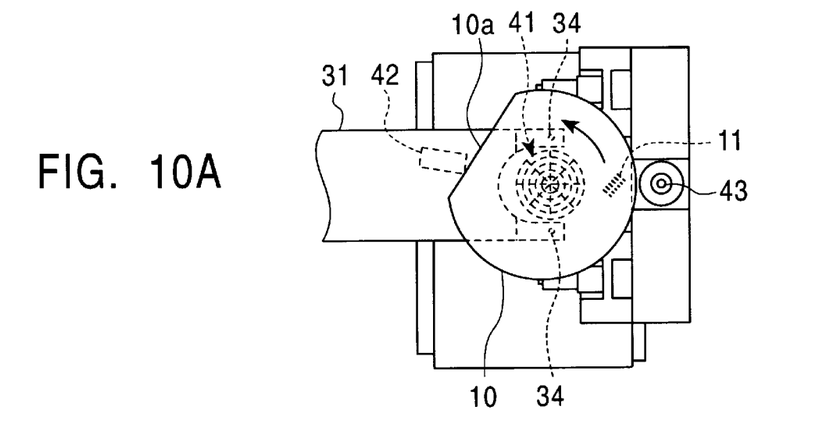
FIG. 10A is a plan view of the orientation unit illustrating an appearance of the wafer wherein the ID mark is put by moving it from the normal position in parallel when the place table is turned to the corrected turn angle.
Figure 10B:
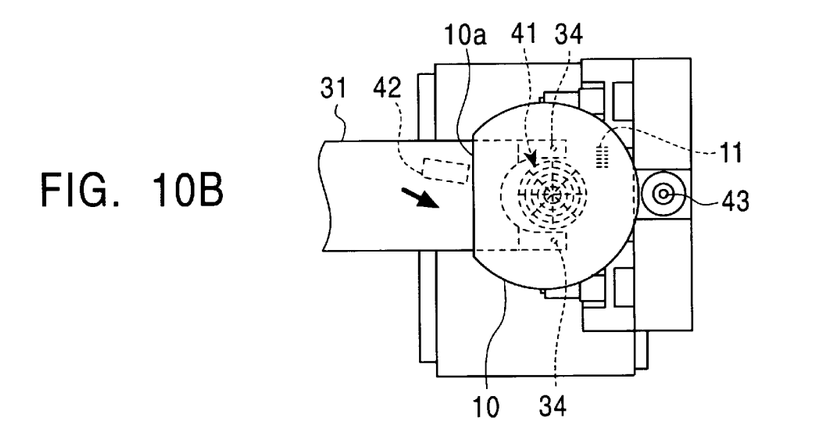
FIG. 10B is a plan view of the orientation unit when the place table has been turned to the corrected turn angle and FIG. 10C is a plan view of the orientation unit when the ID mark of the wafer is set in the OCR.

On the other hand, if the ID mark 11 put in the peripheral part of the wafer 10 is in parallel with the ID mark 11 illustrated in FIG. 4A or FIG. 5A as illustrated in FIG. 4C or FIG. 5C, the wafer 10 is turned from the state as illustrated in FIG. 10A to the state as illustrated in FIG. 10B.

More precisely, if the wafer 10 is placed on the place table 41 and the ID mark 11 is in the orientation of the code 11a as illustrated in FIG. 11, the place table 41 is truned by not the turn angle itself necessary for correcting the tilt quantity θ of the ID mark 11 but the turn angle φ which is corrected in prospect of the turn angle of the turntable 39.

Additionally, when the turntable 39 must be turned for moving the wafer 10 by the transfer unit 3 such that the ID mark 11 comes to right above the OCR 43 if not correcting this turn angle, the orientation of the wafer 10 is changed only by the turning of the turntable 39 in moving by the transfer unit 3 and the orientation of the ID mark 11 is also changed, and it causes that the OCR fails to read the ID mark.

The place table 41 is turned only by the corrected angle φ in prospect of the necessary turning of the turntable 39 based on this circumstance in the present invention. Thus, the position of the ID mark 11 is moved from the position 11a to position 11b as illustrated in FIG. 11 and the direction of the ID mark of this position 11b is also turned to the normal orientation to the OCR 43 when the wafer 10 is actually moved by the transfer unit 3 such that the position lib comes to right above the OCR 43.

The turn angle of the place table 41, the expanding and contracting quantity of the transfer arm 30 and the turn angle of the turntable 39 are calculated based on positional information between the ID mark 11 and the orientation flat 10a (or the notch 10b) on the wafer 10 face that are the position and orientation of the ID mark 11 and the turn angle of the place table 41 is corrected.

Figure 8D:
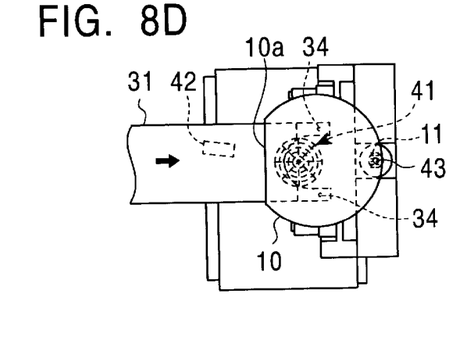
FIG. 8D is a plan view of the orientation unit when the ID mark in the wafer is set in an OCR.
Figure 9B:
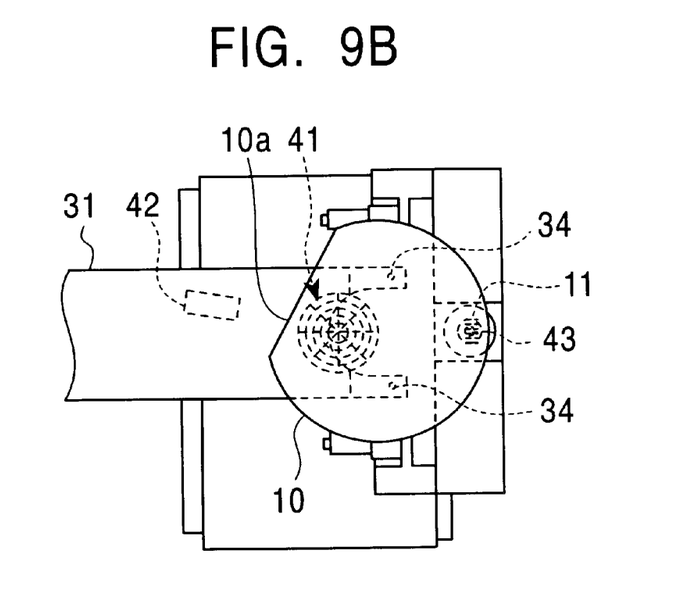
Figure 10C:
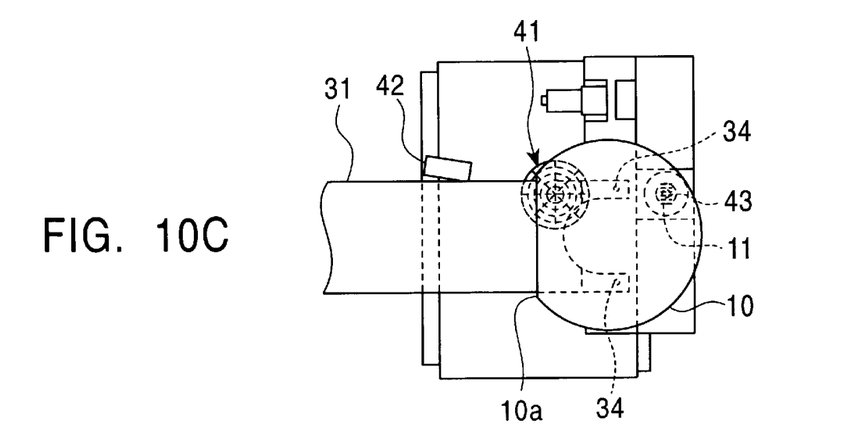

Thus, The place table 41 is turned such that the ID mark 11 is in the predetermined orientation in prospect of the turning of the turntable 39 and the transfer unit 3 is operated by operating the actuator 63 and the electric motor 62 based on the quantity of expanding and contracting the transfer arm 30 which is calculated by the transfer quantity calculation function and the turn angle of the turntable 39 and the wafer 10 is set such that the ID mark 11 comes to right above the OCR 43 as illustrated in FIG. 8D, FIG. 9B or FIG. 10C (step S9). Then, the ID mark 11 whose longitudinal direction is correctly turned sideways (horizontal direction) and is set in the center of the area that the OCR 43 can read.

Additionally, if the position of the ID mark 11 in the wafer 10 is located as in FIGS. 4A, 4B or FIGS. 5A, 5B, the position of the ID mark 11 is located in the almost front of the OCR 34 when the difference between the central position of the wafer 10 placed on the place table 41 and the central position of the place table 41 is large, however the orientation of the ID mark 11 is not always in the predetermined orientation. In this case, the quantity of expanding and contracting the transfer arm 30 and the turn angle of the turntable 39 are calculated by the transfer quantity calculation function of the controller 60 based on the positional relation information of the ID mark 11 and the calculation result of the difference between the rotation center of the wafer 10 and the rotation center of the place table 41 and the turn angle of the place table 41 which is already calculated based on the turn angle of the turntable 39 is corrected by the correction function of the controller 60. As the ID mark 11 is located in front of the OCR 34 in the almost precise orientation and stopped in the readable area of the OCR 34 when the difference between the central position of the wafer 10 and the central position of the place table 41 is little, the turn angle of the turntable 33 can be 0 degrees and the correction angle of the place table 41 becomes 0 degree.

Figure 8E:
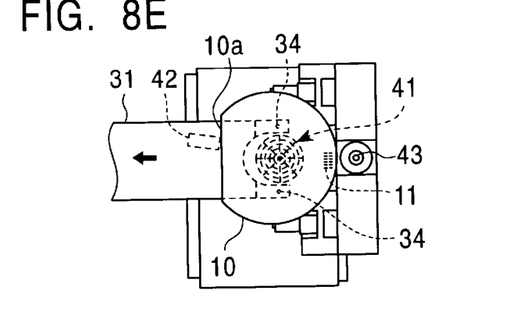
FIG. 8E is a plan view of the orientation unit when the wafer is placed on the place table.

The OCR 43 reads the ID mark 11 in the wafer 10 in the state (step S10), and the transfer unit 3 is operated to place the wafer 10 on the place table 41 in the state that the rotation center of the wafer 10 is adjusted to the rotation center of the place table 41 correctly as illustrated in FIG. 8E (step S11).

Figure 8F:
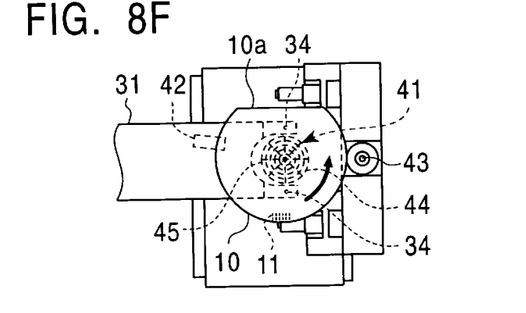
FIG. 8F is a plan view of the orientation unit when the place table is turned and the direction of the wafer is changed.

As illustrated in FIG. 8F, the wafer 10 is sucked and retained by the suction hole 44 and the suction grooves 45, and the place table 41 is turned. In other words, the direction of the wafer 10 is turned in advance such that the orientation flat 10a (or the notch 10b) position is turned to the direction required by the processing equipment 21 when the wafer 10 is transferred to the processing equipment 21 in the next step (step S12).

Figure 8G:
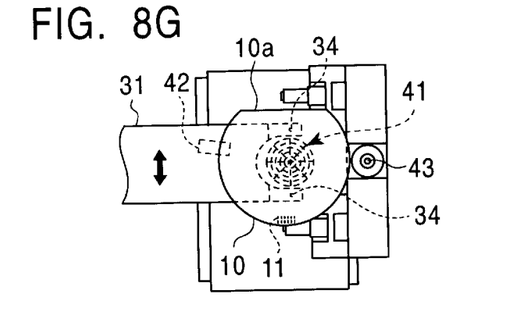
FIG. 8G is a plan view of the orientation unit when the center of a transfer hand is adjusted to the center of the rotation of the place table by moving a transfer hand subtly and FIG. 8H is a plan view of the orientation unit when the wafer is picked up from the positioning unit.

Moreover, the center of the transfer hand 31 is adjusted to the rotation center of the place table 41 by operating the transfer arm 30 as illustrated in FIG. 8G (step S13). As the rotation center of the wafer 10 is adjusted to the rotation center of the place table 41 in the step S11, the center of the transfer hand 31, the rotation center of the place table 41 and the rotation center of the wafer 10 are agreed.

Figure 8H:
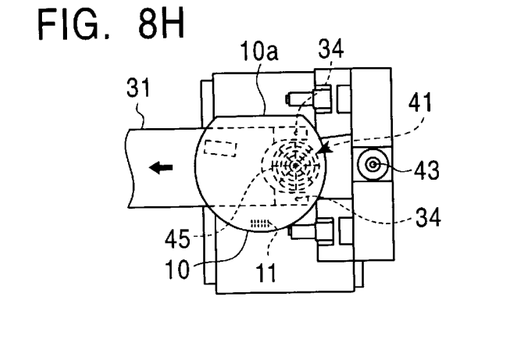

Thus, as illustrated in FIG. 8I, the wafer 10 on the place table 41 is scooped with the transfer hand 31, sucked and retained with by the suction holes 34 and picked up from the orientation unit 4 by bending and stretching the transfer arm 30 (step S14).

The turntable 39 is turned 90 degrees counterclockwise seen from the top as illustrated in FIG. 3B (step S15), the base 38 moves up and down to the predetermined height, the transfer arm 30 is extended and the transfer hand 31 retaining the wafer 10 is inserted into the entrance 21a in the processing equipment 21. Thus, after the inspecting wafer 10 is set in the entrance 21a and the suction in the suction holes 34 is released, the transfer hand 31 is pulled out from the lower part of the wafer 10 by bending and stretching the transfer arm 30 (step S16).

The preferred embodiment of the present invention is described above, and the wafer 10 is oriented without using the conventional move table which can move with high accuracy in such a configuration, and the time necessary for the correction is shorter than the time for correcting the position and orientation of the ID mark 11 by moving the move table horizontally with high accuracy and the transfer efficiency of the wafers 10 is improved as the once calculated turn angle of the place table 41 is corrected to turn the place table 41.

Additionally, the difference etc. of the central position of the wafer 10 is calculated by turning the place table 41 only 360 degrees in the preferred embodiment of the present invention, however it can be calculated after turning multiple times. Furthermore, the place table 41 is stopped when calculating the turn angle by the turn angle calculation function etc. in the preferred embodiment of the present invention, however the turn angle etc. can be calculated with turning the place table 41.

Moreover in the preferred embodiment of the present invention, two pairs of the linear sensors 42 are provided, which can detect the central position of both the 12-inch wafer 10 and the 8-inch wafer 10, so that the buffer cassette 5 for the 8-inch wafer is used for the 8-inch wafer compatible line and the buffer cassette 5 for the 12-inch wafer is for the 12-inch wafer compatible line in the automatic guided vehicle 1. Furthermore, in case of the line for both 8-inch wafer and 12-inch wafer, the shelves for both the 8-inch wafer 10 and the 12-inch wafer 10 are provided side by side in the buffer cassette 5 for example. Whether the wafers 10 are 12-inch or 8-inch is memorized in positional information of the ID mark 11 for example and the extending quantity of the transfer arm 30 and the turn quantity of the turntable 39 are calculated based on it.

The present invention comprised as described above achieves the following effects.

First, as in claim 1, a wafer transfer system, having a transfer unit wherein arms for transferring wafers are provided on a turntable, an orientation unit which adjusts the orientation and direction of the wafer set on a place table and a reading unit which reads an ID mark put in the wafer, comprises a calculation means which calculates the central position of the wafer set on the place table, a turn angle calculation means for calculating a turn angle of the place table necessary for the wafer to be in the predetermined orientation based on a calculation result of the calculation means and positional information of the ID mark received in advance, a transfer quantity calculation means which calculates a quantity of expanding and contracting the arm in the transfer unit and a turn angle of the turntable necessary for setting the wafer in the predetermined orientation such that the ID mark comes to a predetermined position and orientation to the reading unit and a correction means which corrects the turn angle of the place table calculated by the turn angle calculation means, so that the conventional move table which can move with high accuracy is made redundant. Moreover in the present invention, as the position and orientation of the ID mark in the wafer is controlled by correcting the once calculated turn angle of the place table and turning the place table only by the corrected angle, the time necessary for the correction is shorter than the time for correcting by moving the move table horizontally with high accuracy and the transfer efficiency of the wafer is improved.

Meanwhile, as in claim 2, regarding the wafer transfer method having a transfer unit wherein arms for transferring wafers are provided on a turntable, an orientation unit which adjusts the orientation and direction of the wafer set on the place table and a reading unit which reads an ID mark put in the wafer, the central position of the wafer set on the place table is calculated, the turn angle of the place table when the wafer comes to a predetermined orientation is calculated based on the calculated central position of the wafer and positional information of the ID mark received in advance is calculated, a quantity of expanding and contracting the arm and a turn angle of the turntable necessary for setting the wafer in a predetermined orientation such that the ID mark comes to a predetermined position and orientation to the reading unit is calculated, the calculated turn angle of the place table is corrected based on the calculated turn angle of the turntable, the wafer is turned by turning the place table only by the turn angle after correcting and the turned wafer is moved to the reading unit side by the transfer unit and set such that the ID mark is in the predetermined position and orientation to the reading unit, so that the conventional move table which can move with high accuracy is made redundant.

Moreover in the present invention, as the position and orientation of the ID mark in the wafer is controlled by correcting the once calculated turn angle of the place table and turning the place table only by the angle after correcting, the time necessary for the correction is shorter than the time for correcting by moving the move table horizontally with high accuracy and the transfer efficiency of the wafer is improved.

Furthermore, as described in claim 3, regarding an automatic guided vehicle system having the automatic guided vehicle comprising a transfer unit wherein arms for transferring the wafers are provided on a turntable, an orientation unit which adjusts the orientation and direction of the wafer set on the place table and a reading unit which reads the ID mark put in the wafer and the station, when the wafer transfer system as described in claim 1 is provided with the automatic guided vehicle, the wafer is carried to the objective station by the automatic guided vehicle, the ID mark in the wafer is recognized on the automatic guided vehicle, the ID information is transferred to the station and the wafer can be transferred. Moreover, this automatic guided vehicle does not need the move table which can move with high accuracy such that the wafer is in the predetermined orientation and the orientation of the wafer is corrected by the turn quantity of the place table, the turn quantity of the turntable and the extending quantity of the arm, so that the time required for the correction is shorter than the time for correcting by moving the move table horizontally with high accuracy and the wafer is transferred at a higher speed and the transfer efficiency is improved.

What is claimed is:

1. A wafer transfer system having a transfer unit wherein arms for transferring wafers are provided on a turntable, an orientation unit which adjusts the orientation and direction of the wafer set on a place table and a reading unit which reads an ID mark put in the wafer, comprising:

a calculation means which calculates a central position of the wafer set on the place table;

a turn angle calculation means for calculating a turn angle of the place table for the wafer to be in a predetermined orientation based on a calculation result of the calculation means and positional information of the ID mark received in advance;

a transfer quantity calculation means which calculates a quantity of expanding and contracting the arm in the transfer unit and a turn angle of the turntable necessary for setting the wafer in the predetermined orientation such that the ID mark comes to a predetermined position and orientation to the reading unit; and, a correction means which corrects the turn angle of the place table calculated by the turn angle calculation means based on the turn angle of the turn table calculated by the transfer quantity calculation means.

2. A wafer transfer method having a transfer unit wherein arms for transferring wafers are provided on a turntable, an orientation unit which adjusts the orientation and direction of the wafer set on a place table and a reading unit which reads an ID mark put in the wafer, comprising the steps of:

calculating a central position of the wafer set on the place table;

calculating a turn angle of the place table when the wafer comes to a predetermined orientation based on the calculated central position of the wafer and positional information of the ID mark received in advance;

calculating a quantity of expanding and contracting the arm and a turn angle of the turntable in the transfer unit necessary for setting the wafer in a predetermined position such that the ID mark comes to a predetermined position and orientation to the reading unit;

correcting the calculated turn angle of the place table based on the calculated turn angle of the turntable;

turning the place table only by the turn angle after correcting and turning the wafer; and, moving the turned wafer to the reading unit side by the transfer unit and setting the wafer such that the ID mark is in the predetermined position and orientation to the reading unit.

3. The wafer transfer system of claim 1 provided with an automatic guided vehicle having a transfer unit wherein arms for transferring wafers are provided on a turntable, an orientation unit which adjusts the position and direction of the wafer set on the place table and a reading unit which reads the ID mark put in the wafer.

* * * * *